United States Patent [19]
LeBlanc

[11] Patent Number: 5,954,832
[45] Date of Patent: Sep. 21, 1999

[54] METHOD AND SYSTEM FOR PERFORMING NON-STANDARD INSITU BURN-IN TESTINGS

[75] Inventor: Johnny James LeBlanc, Austin, Tex.

[73] Assignee: International Business Machines Corporation, Armonk, N.Y.

[21] Appl. No.: 08/819,559

[22] Filed: Mar. 14, 1997

[51] Int. Cl.$^6$ .................................................. G01R 31/28
[52] U.S. Cl. ............................................ 714/724; 365/201
[58] Field of Search .............................. 371/22.1, 22.31, 371/22.32, 22.33, 22.4, 25.1, 27.2; 395/183.06, 183.01, 183.07, 183.15, 500.05; 364/550, 580; 324/765, 760; 714/1, 2, 8, 48, 706, 723, 726, 727, 728, 729, 733

[56] References Cited

U.S. PATENT DOCUMENTS

| | | |
|---|---|---|
| 4,806,788 | 2/1989 | Tobita . |
| 4,866,714 | 9/1989 | Adams et al. . |
| 5,030,905 | 7/1991 | Figal . |
| 5,233,161 | 8/1993 | Farwell et al. . |
| 5,467,356 | 11/1995 | Choi . |
| 5,519,193 | 5/1996 | Freiermuth et al. . |
| 5,519,333 | 5/1996 | Righter . |
| 5,568,057 | 10/1996 | Kim et al. ................................. 324/755 |
| 5,621,742 | 4/1997 | Yoshino .................................... 371/28 |
| 5,654,588 | 8/1997 | Dasse et al. ............................ 257/754 |
| 5,659,256 | 8/1997 | Charlton et al. ........................ 324/755 |
| 5,661,732 | 8/1997 | Lo et al. ................................. 371/22.2 |
| 5,682,472 | 10/1997 | Brehm et al. ....................... 395/183.01 |
| 5,694,402 | 12/1997 | Butler et al. ........................... 371/22.4 |
| 5,732,209 | 3/1998 | Vigil et al. ......................... 395/183.06 |

Primary Examiner—Robert W. Beausoliel, Jr.
Assistant Examiner—Nadeem Iqbal
Attorney, Agent, or Firm—Anthony V.S. England; Antony P. Ng; Andrew J. Dillon

[57] ABSTRACT

A method and system for performing non-standard insitu burn-in testings is disclosed. In accordance with the method and system of the present invention, a transition counter is provided for each of the integrated-circuit (IC) devices under test. A set of scan strings is transmitted to the transition counter in each of the IC devices while the IC devices are operating under a high-temperature /high-voltage environment. A determination is then made as to whether or not a value from the transition counter in each of the IC devices operating under the high-temperature environment is within a predefined range in response to the transmitted scan strings. An indicator associated with each of the IC devices operating under the high-temperature/high-voltage environment is set in response to the transition counter value that occurred outside the predefined range. The IC devices that do not have the indicator set are subsequently tested again with the IC devices operating in room temperature and nominal voltage. Each IC device that passes the second test will be accepted.

4 Claims, 5 Drawing Sheets

METHOD AND SYSTEM FOR PERFORMING NON-STANDARD INSITU BURN-IN TESTINGS

BACKGROUND OF THE INVENTION

1. Technical Field

The present invention relates to a method and system for testing integrated circuit devices in general and, in particular, to a method and system for performing burn-in tests on integrated circuit devices. Still more particularly, the present invention relates to a method and system for performing non-standard insitu burn-in tests on integrated circuit devices.

2. Description of the Prior Art

It is well-known that integrated circuit (IC) devices exhibit most failures during their early life and towards the end of their useful life. Because these early-life failures can be accelerated by increased temperature, IC devices are commonly subjected to a stress test known as a "burn-in" test in order to eliminate those IC devices that are weak or marginal.

Typically, a burn-in test requires each IC device under test to be exercised in a high-temperature and high-voltage condition. This is because high-temperature and high-voltage separately accelerate different reliability factors of an IC device. A burn-in test is effective only if a vast majority of internal nodes of each IC device under test is being toggled, and there is a robust mixture of charge potential among internal nodes of the IC device under test during the high-temperature and high-voltage conditions. This testing methodology has been traditionally accomplished by utilizing a burn-in method known as "insitu burn-in." During an insitu burn-in test, test patterns are applied to each IC device throughout a test interval, and the output of the IC device under test is also measured throughout this test period to determine its validity. An IC device is considered as "pass" only if it is fully functional during the entire test interval.

Although the traditional insitu burn-in process may be suitable for most IC devices, high-performance IC devices such as CMOS microprocessors that utilize a large amount of dynamic logic may not function properly at this type of high-temperature, high-voltage insitu burn-in conditions. If the dynamic logic within these IC devices is modified to withstand such insitu burn-in conditions, the size/performance of the dynamic logic would become quite uncompetitive.

Besides insitu burn-in tests, other types of burn-in tests may also be utilized. For example, if the IC device under test is not powered during the entire test interval, it is referred to as a static burn-in test. If the IC device under test is in some type of operation during the entire test interval, but the output from the operation is not monitored, it is then referred to as a dynamic burn-in test. Although either the static or dynamic burn-in test can be utilized as a substitute for the insitu burn-in test, there is no assurance that the internal node activities required for a successful burn-in test are actually occurring. Thus, the quality of the burn-in test may be suspect if the traditional standard insitu burn-in condition is not employed.

Here lies the dilemma. On one hand, IC devices having dynamic logic cannot be made to be robust enough to survive through a standard insitu burn-in test or the IC devices will become too large and too slow to remain competitive. On the other hand, a less harsh burn-in condition such as a static or a dynamic burn-in test cannot provide the required assurance and guarantee for the quality and reliability of the outgoing product. Consequently, it would be desirable to provide an improved method for performing a burn-in test on IC devices such that a different burn-in condition may be applied without sacrificing the integrity of the burn-in test as intended.

SUMMARY OF THE INVENTION

In view of the foregoing, it is therefore an object of the present invention to provide an improved method and system for testing integrated circuit devices.

It is another object of the present invention to provide an improved method and system for performing insitu burn-in testings on integrated circuit devices.

In accordance with the method and system of the present invention, a transition counter is provided for each of the integrated-circuit (IC) devices under test. A set of scan strings is transmitted to the transition counter in each of the IC devices while the IC devices are operating under a high-temperature environment. A determination is then made as to whether or not a value from the transition counter in each of the IC devices operating under the high-temperature environment is within a predefined acceptable range in response to the transmitted scan strings. An indicator associated with each of the IC devices operating under the high-temperature environment is set in response to the transition counter value that occurred outside the predefined range. The IC devices that do not have the indicator set are subsequently tested again with the IC devices operating in room temperature. Each IC device that passes the second test will be accepted.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
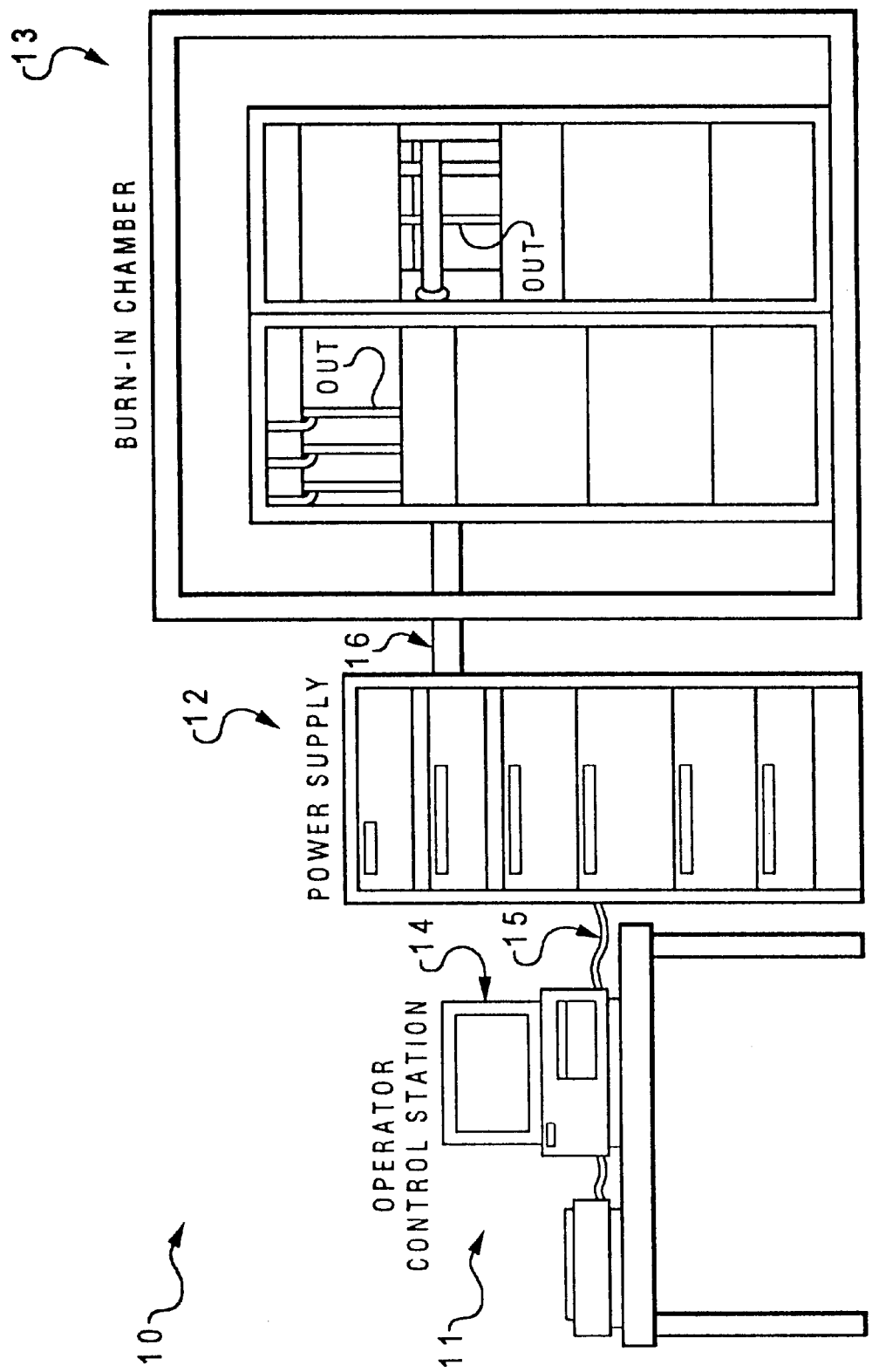
FIG. 1 is a diagram of a typical burn-in environment that utilizes a preferred embodiment of the present invention.

Referring now to the drawings and in particular to FIG. 1, there is depicted a diagram of a typical burn-in environment 10 that utilizes a preferred embodiment of the present invention. As shown, burn-in environment 10 includes an operator control station 11, a power supply 12, and a burn-in chamber 13. Burn-in environment 10 may be controlled by an operator at operator control station 11 via a personal computer 14 such as an Aptiva™ manufactured by the International Business Machines Incorporation. Personal computer 14 is utilized for controlling and monitoring the entire burn-in process. Personal computer 14 is connected to power supply 12 and burn-in chamber 13 via a line of communication including, illustratively, a two-wire interface 15 and interface 16. Within burn-in chamber 13, the line of communication is a two-wire daisy chain joining a number of devices under test (DUTs). Power supply 12 is associated with burn-in chamber 13 via a power line connected to the DUTs within burn-in chamber 13.

All burn-in parameters may be regulated via operator control station 11. The operator has direct control of the stresses applied to the DUTs within burn-in chamber 13. A combination of logic circuits within each of the DUTs may assume a predetermined status or exchange status, that the operator from operator control station 11 is capable of monitoring, checking, controlling, or retrieving, with the help of personal computer 14, in order to ascertain whether the DUTs are behaving as expected during the entire burn-in period.

Figure 2:
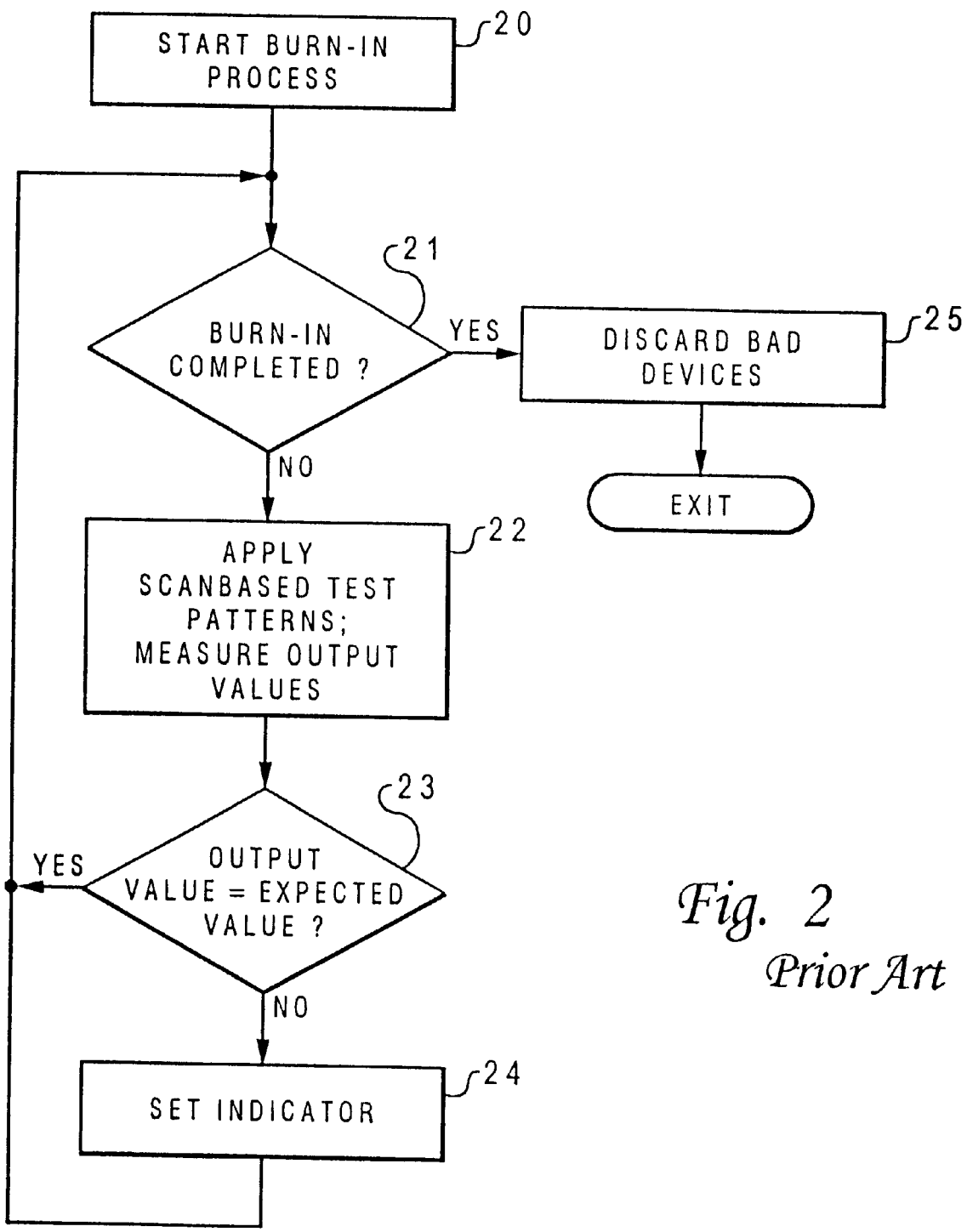
FIG. 2 is a high-level logic flow diagram for performing an insitu burn-in test in accordance with the prior art.

With reference now to FIG. 2, there is illustrated a high-level logic flow diagram for performing an insitu burn-in test according to the prior art. After the burn-in process has started, as shown in block 20, a determination is made as to whether or not the burn-in process has completed, as depicted in block 21. If the burn-in process has not yet completed, a scanbased test pattern is applied to each device under test (DUT) and from which an output value is read, as shown in block 22. In some systems, instead of a scanbased test pattern, a Logic Built-In Self Test (LBIST) sequence generated by a pseudo-random pattern generator (PRPG) is supplied within each DUT and the multiple input sequence registers (MISRs) are read. Then, a determination is made as to whether or not the output values are equal to the expected values, as illustrated in block 23. If the output values equal the expected values, then the process returns back to block 20 for continuing the burn-in process. But, if the output values do not equal the expected values, then an indicator is set for the DUT that does not provide the correct value, as shown in block 24, before the process returns back to block 20 for continuing the burn-in process. After the burn-in process has been completed, the DUTs that do not pass the burn-in test (i.e., having an indicator set) will be discarded, as shown in block 25, while the rest of the devices will be accepted. The process exits at this point.

Instead of mandating all circuits function correctly all the time during the standard insitu burn-in process, the present invention incorporates test logic circuits within the DUTs to provide an indication of acceptable internal nodal activity. In other words, rather than measuring the expected values, the present invention utilizes an on-chip logic circuit to count transitions on a set of scan strings.

Figure 3:
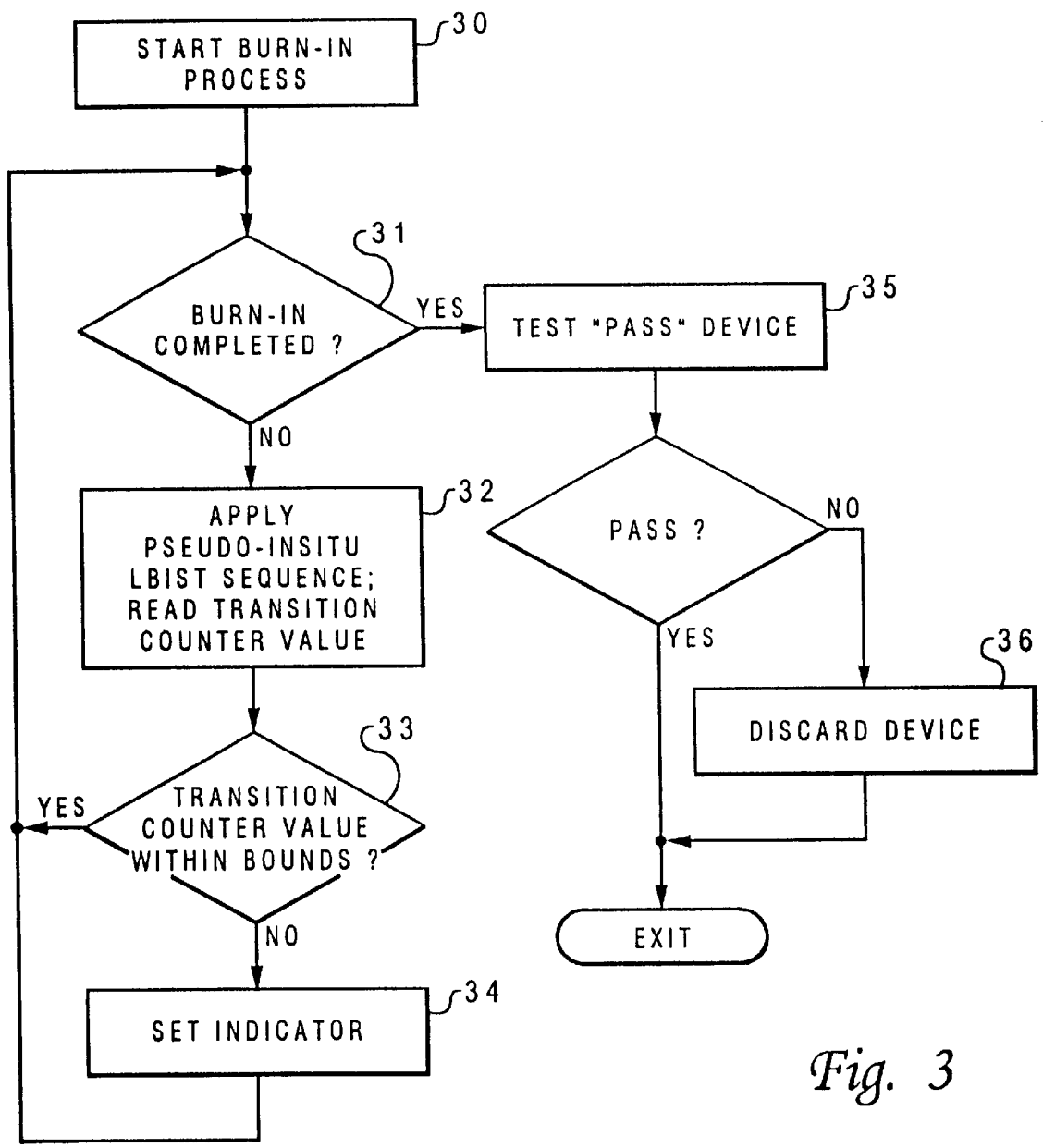
FIG. 3 is high-level logic flow diagram for performing a non-standard insitu burn-in test in accordance with a preferred embodiment of the present invention.

Referring now to FIG. 3, there is illustrated a high-level logic flow diagram for performing a non-standard insitu burn-in test in accordance with a preferred embodiment of the present invention. After the burn-in process has started, as shown in block 30, a determination is made as to whether or not the burn-in process has completed, as depicted in block 31. If the burn-in process has not yet completed, an LBIST sequence is applied to each DUT and the respective transition counter values are read, as shown in block 32. A determination is then made as to whether or not the transition counter values are within the bounds of expected values, as illustrated in block 33. If the transition counter values are within bounds, then the process returns back to block 31 for continuing the burn-in process. But, if the transition counter values are out of bounds, then an indicator is set for the DUT that does not provide the correct value, as shown in block 34, before the process returns back to block 31 for continuing the burn-in process.

After the burn-in process has been completed, the DUTs that do not pass the burn-in test (i.e., having the indicator set) will be discarded while the rest of the DUTs will be tested again in a non-burn-in condition such as room temperature, as shown in block 35. At this point, if a DUT does not pass, it will be discarded, as depicted in block 36. The process exits at this point.

Figure 4:
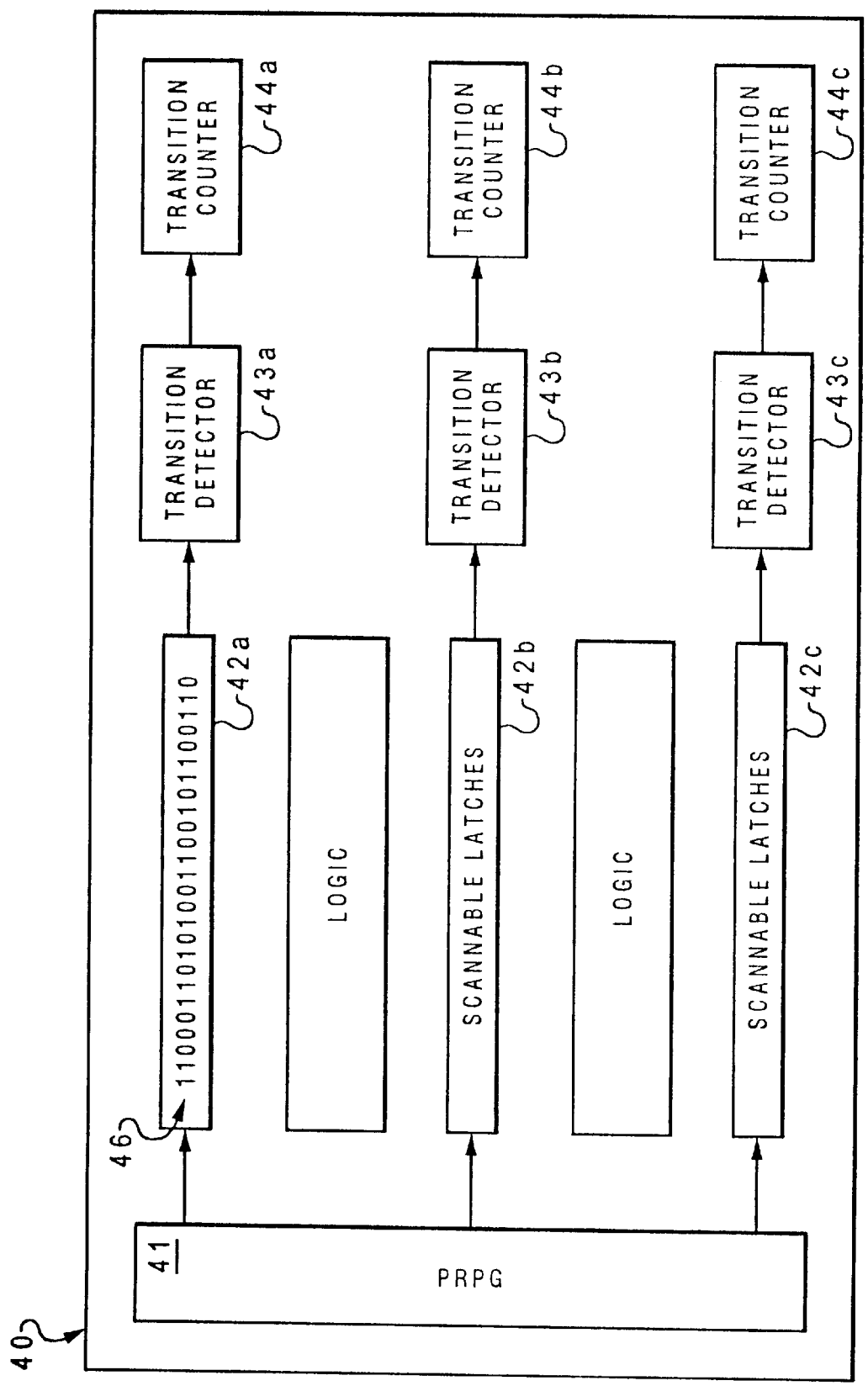
FIG. 4 is a block diagram of an integrated-circuit device having a Logic Built-In Self Test (LBIST) circuit in accordance with a preferred embodiment of the invention.

With reference now to FIG. 4, there is illustrated a block diagram of a device having an LBIST circuit for performing non-standard insitu burn-in testings in accordance with a preferred embodiment of the present invention. As shown, device 40 includes a PRPG 41, scannable latches 42a, 42b, 42c, transition detectors 43a, 43b, 43c respectively for each of scannable latches 42a, 42b, 42c, and transition counters 44a, 44b, 44c respectively for each of transition detectors 43a, 43b, 43c. Although three sets of transition detectors and transition counters are illustrated in FIG. 4, the actual number that is utilized with a device may vary depending on the design of the device.

In device 40 of FIG. 4, a set of scan string 46 generated from PRPG 41 may be sent to transition counter 44a via transition detector 43a. In order to determine the "correct" transition value for the step shown in block 33 of FIG. 3, transition counter 44a would first be initialized to a logical "0" and then set to an increment mode. Subsequently, an LBIST sequence would be run (or simulated) to determine the number of transitions that occur over all scan-unload steps. To decrease the granularity of this value, one can utilize an average "transitions per LBIST cycle value" rather than the final "overall transition value." If the number of LBIST cycles is an even multiple of two, this value can be determined by shifting the contents of transition counter 44a "n" bits to the right, where $2^n$=number of LBIST cycles. The expected average transitions/LBIST cycles would then be known.

As an alternative embodiment of the invention, transition counter 44a may be first initialized to a "correct" transition value obtained previously. Transition counter 44a is then set to a decrement mode. The "Pass Value" register would be initialized to a value equal to an "acceptable miscompare threshold." For example, if no miscompare is allowed, the "pass value" register would be set to "0." If an average of five erroneous transitions per LBIST cycles is acceptable, then the "Pass Value" register is initialized to "5." After the burn-in process has been completed, if the number of "transitions per LBIST cycle" is less or equal to the "Pass Value" register value, a comparator would provide a 1-bit "GO" value indicating that an acceptable burn-in test has been performed. If the number of transitions per cycle is greater than the "Pass Value" register value, the comparator's 1-bit "NO GO" value would indicate that the quality of the burn-in test is unacceptable, as depicted in block 34 of FIG. 3.

Since glitches can cause more or less transitions than are expected from the "correct" transition value, the transition counter must switch from decrement mode to increment mode automatically as the result of an underflow condition (that is, when the decrementer reaches the all-0's state, it should transition to increment mode such that the next transition the transition counter receives will cause the transition counter to go to 000 . . . $1_{hex}$ rather than FFF . .

Figure 5:
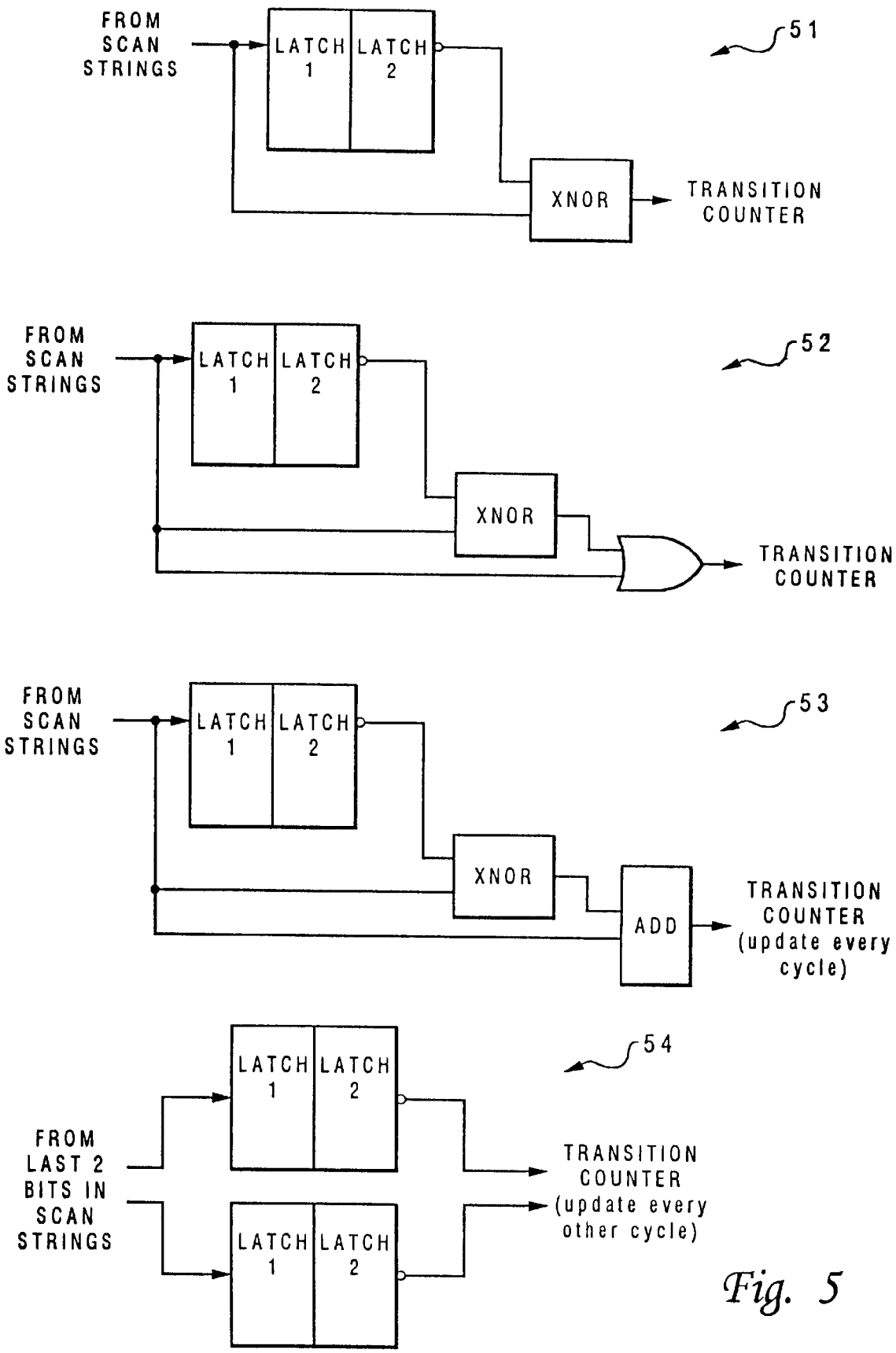
FIG. 5 consists of block diagrams of several transition detector implementation examples.

. $F_{hex}$. This is necessary to perform the absolute value function of the expected count—measured count (i.e., "correct" count—measured burn-in count). The implementation of transition detectors for the present invention is well-known to those who are skilled in the art; however, several examples of transition detector implementation are illustrated in FIG. 5. Transition detectors 51 and 52 are the simplest to implement, while transition detectors 53 and 54 provide the best protection from aliasing.

As has been described, the present invention provides an improved method for performing non-standard insitu burn-in testings on integrated-circuit devices. Unlike dynamic burn-in, the present invention provides a high degree of assurance that each "passing" device under test did indeed achieve acceptable node toggle and charge potential states during the entire burn-in testing.

It is also important to note that, although the present invention has been described in the context of a fully functional computer system, those skilled in the art will appreciate that the mechanisms of the present invention are capable of being distributed as a program product in a variety of forms, and that the present invention applies equally regardless of the particular type of signal-bearing media utilized to actually carry out the distribution. Examples of signal-bearing media include but are not limited to recordable-type media such as floppy disks or CD ROMs and transmission-type media such as analogue or digital communications links.

While the invention has been particularly shown and described with reference to a preferred embodiment, it will be understood by those skilled in the art that various changes in form and detail may be made therein without departing from the spirit and scope of the invention.

What is claimed is:

1. A burn-in testing system, wherein said burn-in testing system provides non-standard insitu burn-in testing on a plurality of integrated-circuit (IC) devices that cannot function properly in a standard insitu burn-in test, said burn-in testing system comprising:

a transition counter within each of said plurality of IC devices, wherein said transition counter is associated with a transition detector;

means for transmitting a set of scan strings to said transition counter within each of said plurality of IC devices while said plurality of IC devices are operating under a high-temperature environment;

means for determining whether or not a value from each transition counter in response to said scan strings is within a predefined acceptable range;

means for testing all of said plurality of IC devices that fall within said predefined acceptable range, during operation under a room temperature environment; and means for accepting each of said plurality of IC devices that passes said testing.

2. The burn-in testing system according to claim 1, wherein said set of scan strings is generated by a pseudo-random pattern generator.

3. The burn-in testing system according to claim 1, wherein said burn-in system further includes a means for discarding all of said plurality of IC devices that do not fall within said predefined acceptable range.

4. The burn-in testing system according to claim 1, wherein said transition counter can increment or decrement.

* * * * *